US010557567B2

(12) United States Patent
Nikkel

(10) Patent No.: US 10,557,567 B2
(45) Date of Patent: Feb. 11, 2020

(54) FLUIDIC MICRO ELECTROMECHANICAL SYSTEM

(71) Applicant: Hewlett-Packard Development Company, L.P., Houston, TX (US)

(72) Inventor: Eric L. Nikkel, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/062,379

(22) PCT Filed: Apr. 19, 2016

(86) PCT No.: PCT/US2016/028270
§ 371 (c)(1),
(2) Date: Jun. 14, 2018

(87) PCT Pub. No.: WO2017/184119
PCT Pub. Date: Oct. 26, 2017

(65) Prior Publication Data
US 2018/0372243 A1    Dec. 27, 2018

(51) Int. Cl.
*F16K 99/00* (2006.01)
*B41J 2/14* (2006.01)
*B41J 2/175* (2006.01)
*B01L 3/00* (2006.01)

(52) U.S. Cl.
CPC .... *F16K 99/0057* (2013.01); *B01L 3/502738* (2013.01); *B41J 2/14048* (2013.01); *F16K 99/0007* (2013.01); *B01L 2400/0605* (2013.01); *B01L 2400/0638* (2013.01); *B41J 2/17596* (2013.01); *B41J 2202/05* (2013.01); *F16K 2099/0094* (2013.01)

(58) Field of Classification Search
CPC ............ F16K 99/0057; F16K 99/0007; F16K 2099/0094; B01L 3/502738; B01L 2400/0605; B01L 2400/0638; B41J 2/17596; B41J 2202/05; B41J 2/14048
See application file for complete search history.

(56) References Cited

U.S. PATENT DOCUMENTS

| 4,585,209 A | 4/1986 | Aine et al. |
| 5,413,142 A | 5/1995 | Johnson et al. |
| 5,899,218 A | 5/1999 | Dugan |

(Continued)

FOREIGN PATENT DOCUMENTS

| EP | 0569480 | 11/1993 |
| WO | WO-2011133014 | 10/2011 |

OTHER PUBLICATIONS

Bohm, S. et al., "A plastic micropump constructed with conventional techniques and materials", Elsevier Science S.A., Nov. 2, 1999, 15 pages.

*Primary Examiner* — Geoffrey S Mruk
(74) *Attorney, Agent, or Firm* — Rathe Lindenbaum LLP

(57) ABSTRACT

An example fluidic micro electromechanical system may include a substrate and a first layer supported by the substrate. The first layer forms sides of a chamber, a passage through one of the sides and a chamber and a check valve leaf. The check valve leaf is pivotable about an axis non-parallel to the substrate to open and close the passage. The system may further include a second layer over the chamber, an opening into the chamber and a resistor supported within the chamber.

10 Claims, 6 Drawing Sheets

(56) References Cited

U.S. PATENT DOCUMENTS

| | | |
|---|---|---|
| 6,334,761 B1 | 1/2002 | Tai et al. |
| 6,409,316 B1 | 6/2002 | Clark et al. |
| 7,832,429 B2 | 11/2010 | Young et al. |
| 8,056,827 B2 | 11/2011 | Xu |
| 2002/0030721 A1* | 3/2002 | Asakawa et al. .......... B41J 2/05 347/65 |
| 2002/0033856 A1 | 3/2002 | Moon et al. |
| 2004/0134538 A1 | 7/2004 | Cotte et al. |
| 2006/0078475 A1 | 4/2006 | Tai et al. |
| 2008/0128390 A1 | 6/2008 | Chen |
| 2014/0037481 A1 | 2/2014 | Stephane |

* cited by examiner

FLUIDIC MICRO ELECTROMECHANICAL SYSTEM

BACKGROUND

Microfluidics technology has found many applications in the biomedical field, cell biology, protein crystallization and other areas. The scale of microfluidics presents many design challenges.

DETAILED DESCRIPTION OF EXAMPLES

The present disclosure describes example fluidic micro electromechanical system (MEMS) devices. The disclosure describes example check valves and unidirectional pumps as part of such MEMS devices. The check valves and unidirectional pumps have architectures that facilitate their fabrication as part of MEMS devices.

Figure 1:
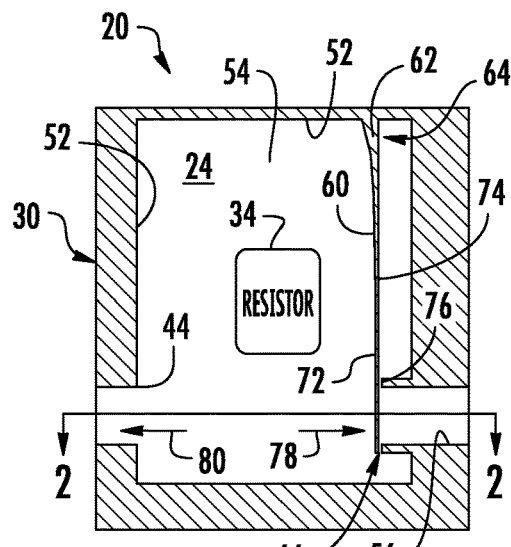
FIG. 1 is a sectional view of an example fluidic micro electromechanical system (MEMS) device.
Figure 2:
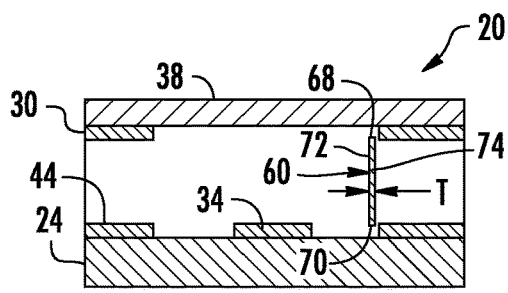
FIG. 2 is a sectional view of the device of FIG. 1 take along line 2-2.

FIGS. 1 and 2 illustrate an example fluidic micro electromechanical system (MEMS) device 20. FIG. 1 is a sectional view of an example fluidic micro electromechanical system (MEMS) device 20. FIG. 2 is a sectional view of device 20 along line 2-2 of FIG. 1. Device 20 comprises a fluidic MEMS one way pump which utilizes a one-way check valve and a bubble jet resistor to move or drive fluid in a microfluidic device. As will be described hereafter, device 20 provides a chamber, a passage through sides of the chamber and a check valve leaf in one single unitary layer. The check valve leaf pivots about an axis that is nonparallel to the substrate that supports the layer. The architecture of device 20 facilitates fabrication of device 20 as part of a MEMS and as part of a microfluidic system.

Mems device 20 comprises substrate 24, layer 30, resistor 34, top layer 38 and outlet opening 44. Substrate 24 comprises an underlying base or foundation of MEMS device 20. Although only a portion of substrate 24 is illustrated, substrate 24 may extend well beyond device 20, supporting other MEMS devices as well as microfluidic passages.

For purposes of this disclosure, the term "microfluidic" refers to volumes containing fluids or through such fluid flow, wherein such volumes have at least one dimension in the range of a micrometer or tens of micrometers. For purposes of this disclosure, the term "microfluidic" also refers to such volumes have at least one dimension smaller than a micrometer.

In one implementation, substrate 24 comprises a layer of silicon or a silicon based material. In other implementations, substrate 24 may comprise other materials. For example, in other implementations, substrate may be formed from a polymeric material, a glass material or a ceramic material.

Layer 30 comprises a unitary layer or layer structure of material supported by substrate 24 which forms and comprises sides 52 of a chamber 54, a passage 56 and check valve leaf 60. Sides 52 of chamber 54 extend about resistor 34. Passage 56 extends through one of sides 52.

Check valve leaf 60 comprises a bendable flap extending from one of sides 52 across passage 56. Check valve 60 has a fixed end 64, a free end 66, an upper edge 68 (shown in FIG. 2), a lower edge 70 (shown in FIG. 2) and opposite faces 72, 74. Fixed end 64 is integral with and is formed as part of a single unitary body with those portions of layer 30 forming sides 52. As shown by FIG. 2, in the example illustrated, the fixed end 64 and those portions of leaf 60 proximate or adjacent to sidewall 52 have a first thickness while those portions of leaf 60 proximate or adjacent to free end 66 have a second thickness less than the first thickness. In the example illustrated, leaf 60 gradually tapers towards free end 66, facilitating bending or flexing of leaf 60. In other implementations, leaf 60 may have a stepped profile such that the thickness of leaf 60 diminishes as it approaches free end 66 to facilitate bending.

In the example illustrated, leaf 60 has a length L (extending between fixed end 64 and free end 66) and a thickness T. The length L of leaf 60 extends parallel to substrate 24. In the example illustrated, the length of leaf 60 extends from one side of resistor 34 across and beyond the other side of resistor 34. In one implementation, the ratio of L/T is at least 3. In one implementation, length L is at least 20 um. The L/T ratio and the length of leaf 60 further facilitate flexing or bending of leaf 60 in response to lower pressure differentials exert on opposite sides of leaf 60 adjacent passage 56.

Check valve leaf 60 is pivotable about a "living hinge", a flexure bearing formed from the same materials as the two rigid pieces it connects. Check valve leaf 60 pivots or flexes about an axis 62 that is nonparallel to substrate 24. In the example illustrated, check valve leaf 60 is pivotable about an axis 62 that is perpendicular to substrate 24.

In one implementation, layer 30 has a thickness of at least 20 μm and no greater than 50 μm. In one implementation, layer 30 comprises a polymer. In one implementation, layer 30 comprises a photo-imagable or photosensitive polymer or other material that may be shaped and formed using an exposure/developing process as described herein. For example, in one implementation, layer 30 may comprise an epoxy-based negative photoresist such as SU8 (a Bisphenol A Novolac epoxy that is dissolved in an organic solvent (gamma-butyrolactone GBL or cyclopentanone, depending on the formulation) and up to 10 wt % of mixed Triarylsulfonium/hexafluoroantimonate salt as the photoacid generator)). FIG. 1 illustrates a portion of layer 30. Other portions of the same layer 30 (not shown) may form other MEMS devices or structures. For example, other portions of layer 30 may additionally form or surround at least portions of a microfluidic channel or passage, a fluid pump, fluid filter, a material separator, a sensor, a heater, an outlet or other MEMS devices.

Resistor 34 comprises an electrically resistive device within or proximate to chamber 54 and connected or connectable to a source of electrical current, such as a pulse voltage supply. In response to an applied electrical current, resistor 34 generates a sufficient amount of heat to raise the temperature of liquid within chamber 54 to a temperature above the nucleation temperature of the liquid, vaporizing portions of the liquid to create a bubble, wherein the bubble moves or ejects liquid within chamber 54. In one implementation, resistor 34 is formed directly upon substrate 24. In another implementation, resistor 34 is formed upon a floor formed by layer 30. Examples of materials from which resistor 34 may be formed include, but are not limited to, TaAl and WSiN.

In one implementation, resistor 34 is coated or covered a passivation layer or a cavitation layer, a layer of material that protects resistor 34 from interaction with the liquid contained within chamber 54 and inhibits contamination of the liquid within chamber 54 from such interactions. Examples of materials of passivation layer and/or cavitation layer comprise SiC, SiN, HfO$_2$ and diamond like carbons (DLCs), a class of amorphous carbon materials.

Top layer 38 (shown in FIG. 2) comprises a layer of material formed above layer 30. In the example illustrated, top layer 38 is spaced from upper edge 68 of leaf 60. In the example illustrated, top layer 38 is formed directly on top of and in contact with layer 30. In one implementation, top layer 38 is formed from the same material as layer 30. For example, in one implementation, top layer 38 is formed from SUB. In other implementations, top layer 38 may be formed from a metal or other material.

Outlet opening 44 comprises an opening in communication with the interior of chamber 54 such that liquid may be ejected from chamber 54 through outlet opening 44. In the example illustrated, outlet opening 44 is provided by a passage formed through one of the sides 52 of layer 30. In the example illustrated, opening 44 is formed directly opposite to passage 56. In other implementations, outlet opening 44 may be formed through other sides 52 of chamber 54. In yet other implementations, outlet opening 44 may be formed through the floor or through the ceiling of chamber 54.

In use, liquid may enter chamber 54 through passage 56, wherein leaf 60 may pivot about axis 62 in a clockwise direction towards resistor 34. Application of electric current to resistor 34 creates an expanding bubble, wherein liquid within chamber 54 exerts force against face 72, pivoting leaf 60 about axis 62 in a counter-clockwise direction against the lip or perimeter 76 of passage 56, sealing passage 56 or inhibiting flow through passage 56 in the direction indicated by arrow 78. At the same time, the expanding bubble forces liquid within chamber 54 through outlet opening 44 as indicated by arrow 80. Subsequent collapse of the bubble may draw liquid back into chamber 54 to refill chamber 54. During such refilling, negative pressure within chamber 54 may exert a force upon face 74, once again pivoting leaf 60 in a clockwise direction about axis 62. During the discharge of liquid from chamber 54 and the filling of chamber 54, leaf 60 serves as a microfluidic check valve for chamber 54.

Figure 3:
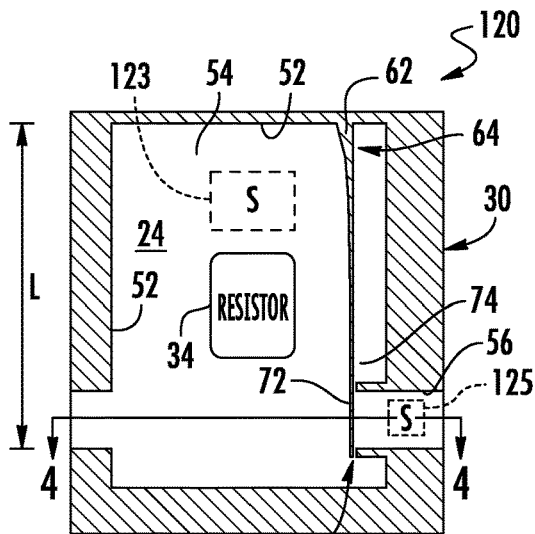
FIG. 3 is a sectional view of an example fluidic MEMS device.
Figure 4:
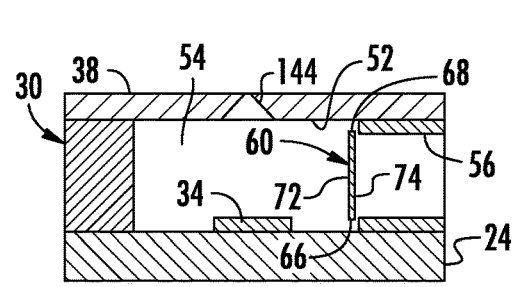
FIG. 4 is a sectional view of the device of FIG. 3 take along line 4-4.

FIGS. 3 and 4 illustrate an example fluidic MEMS device 120. FIG. 3 is a sectional view of an example fluidic MEMS device 120. FIG. 4 is a sectional view of device 120 along line 4-4 of FIG. 3 [[1]]. Device 120 is similar to device 20 described above except that device 120 comprises outlet opening 144 (shown in FIG. 4) in place of outlet opening 44. Those remaining structures or components of device 120 which correspond to device 20 are numbered similarly.

Outlet opening 144 comprises an opening through top layer 38. In the example illustrated, outlet opening 144 comprises a nozzle opening. Leaf 60 forms a one-way check valve that inhibits backflow of liquid through passage 56, enhancing the ability of resistor 34 to eject fluid through the nozzle provided by outlet opening 144. In one implementation, device 120 comprises a device to selectively ejected droplets of liquid, such as ink, reagent or other solutions in a controlled manner onto a substrate or sample testing surface.

In yet another implementation, device 120 comprises a device that ejects liquid through outlet opening 144 to facilitate testing of liquid or analyte contained in the liquid. For example, in one implementation, as indicated by broken lines, device 120 may additionally comprise a sensor 123 formed within chamber 54. In such an implementation, the liquid may be drawn over sensor 123 for sensing, wherein after such sensing, the liquid may be expelled through opening 144 (in response to the expanding bubble produced by resistor 34) as new liquid and analyte for sensing is drawn through passage 56 (in response to the collapsing bubble). For example, sensor 123 may comprise an optical sensor such as a photo emitter-detector pair or a surface enhanced luminescence sensor or surface enhanced Raman spectroscopy sensor. In some implementations, sensor 123 may comprise an impedance sensor or other type of sensor.

As further shown by FIG. 3, in some implementations, device 120 may comprise a sensor 125 (shown in broken lines) formed within or along passage 56. In one implementation, passage 56 may comprise a constriction having a cross-sectional area dimensioned to restrict the passage of particles or cells to a serial or single file flow across sensor 125. In such an implementation, liquid is drawn through passage 156, across sensor 125 and into chamber 54, where the liquid is ejected or discharged through outlet opening 144.

Figure 5:
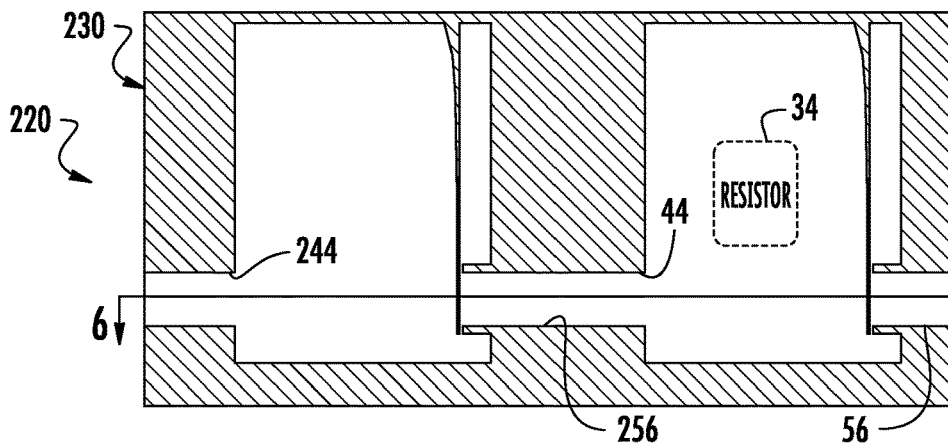
FIG. 5 is a sectional view of an example fluidic MEMS device.
Figure 6:
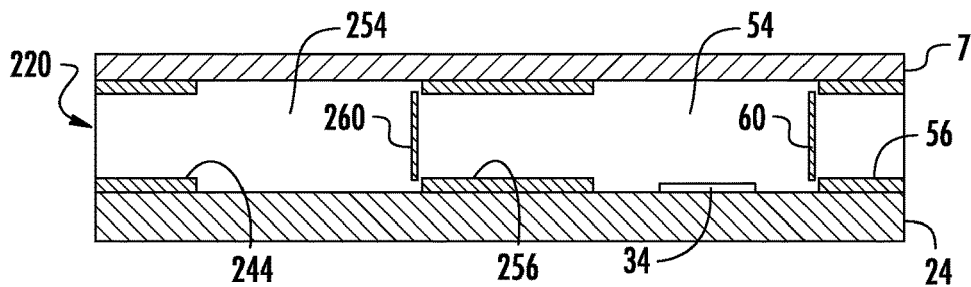
FIG. 6 is a sectional view of the device of FIG. 5 take along line 6-6.

FIGS. 5 and 6 illustrate an example fluidic MEMS device 220. FIG. 5 is a sectional view of an example fluidic MEMS device 220. FIG. 6 is a sectional view of device 220 along line 6-6 of FIG. 5. Device 220 is similar to device 20 described above except that device 220 comprises layer 230 in place of layer 30. Those remaining structures or elements of device 220 which correspond to structure elements of device 20 are numbered similarly.

Layer 230 comprises a unitary layer or layer structure of material supported by substrate 24. Layer 230 is similar to layer 30 except that layer 230 additionally forms and comprises sides 252 of a second chamber 254, a second passage 256 and a second check valve leaf 260. Those components or structures of layer 230 which correspond to structures or components of layer 30 are numbered similarly. Second chamber 254 is separated from chamber 54 by portions of layer 230. Although chambers 54 and 254 are each illustrated as being rectangular in shape, in other implementations, chambers 54 254 may each have other shapes and may be different from one another. Passage 256 extends from the interior of chamber 254 to outlet opening 44 of chamber 54.

Check valve leaf 260 is similar to check valve leaf 60 described above except that check valve leaf 260 extends from one of sides 252 of chamber 254 across passage 256. Those structures or components of check valve leaf 260 which correspond to structures or components of check valve leaf 60 are numbered similarly. As with check valve leaf 60, check valve leaf 260 is pivotable about a "living hinge. Check valve leaf 260 pivots or flexes about an axis 262 that is nonparallel to substrate 24. In the example illustrated, check valve leaf 260 is pivotable about an axis 262 that is perpendicular to substrate 24.

As with layer 30, layer 230 may have a thickness of at least 20 μm and no greater than 50 μm. In one implementation, layer 230 comprises a polymer. In one implementation, layer 230 comprises a photo-imagable or photosensitive polymer or other material that may be shaped and formed using an exposure/developing process as described herein. For example, in one implementation, layer 230 may comprise an epoxy-based negative photoresist such as SU8 (a Bisphenol A Novolac epoxy that is dissolved in an organic solvent (gamma-butyrolactone GBL or cyclopentanone, depending on the formulation) and up to 10 wt % of mixed Triarylsulfonium/hexafluoroantimonate salt as the photoacid generator)). FIG. 5 illustrates a portion of layer 230. Other portions of the same layer 230 (not shown) may form other MEMS devices or structures. For example, other portions of layer 230 may additionally form or surround at least portions of a microfluidic channel or passage, a fluid pump, fluid filter, a material separator, a sensor, a heater, an outlet or other MEMS devices.

Outlet opening 244 comprises an opening in communication with the interior of chamber 254 such that liquid may be ejected from chamber 254 through outlet opening 244. In the example illustrated, outlet opening 244 is provided by a passage formed through one of the sides 252 of layer 230. In the example illustrated, opening 244 is formed directly opposite to passage 256. In other implementations, outlet opening 244 may form through other sides 252 of chamber 254. In yet other implementations, outlet opening 244 may be formed through the floor or through the ceiling of chamber 254.

Figure 7:
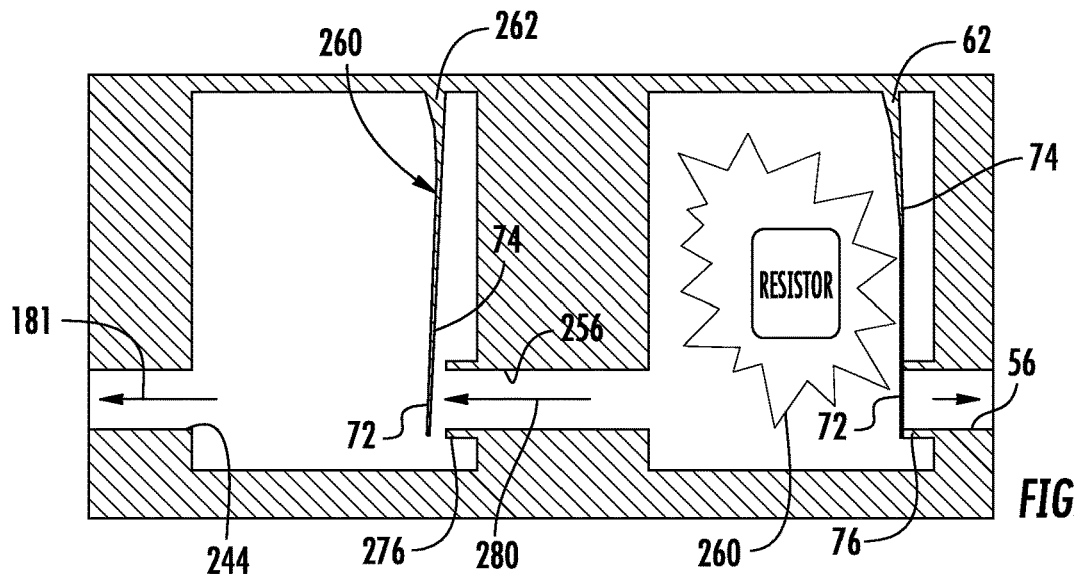
FIG. 7 is a sectional view of the device of FIG. 5 illustrating operation of the device.

FIG. 7 illustrates one example use of device 220. As with the use of device 20, liquid may enter chamber 54 through passage 56, wherein leaf 60 may pivot about axis 62 in a clockwise direction towards resistor 34. As shown by FIG. 7, application electric current to resistor 34 creates an expanding bubble 260 (schematically illustrated), wherein liquid within chamber 54 exerts force against face 72, pivoting leaf 60 about axis 62 in a counter-clockwise direction against the lip or perimeter 76 of passage 56, sealing passage 56 or inhibiting flow through passage 56 in the direction indicated by arrow 78. At the same time, the expanding bubble forces liquid within chamber 54 through outlet opening 44 and through passage 256 into chamber 254 as indicated by arrow 280. Liquid flowing into chamber 254 exerts a force against face 74 of leaf 260, causing leaf 260 to pivot in a clockwise direction about axis 262. Existing liquid within chamber 254 is further expelled through outlet opening 244 as indicated by arrow 181.

Subsequent collapse of the bubble may draw liquid back into chamber 54 through passage 56 to refill chamber 54. During such refilling, liquid may exert a force against face 74, once again pivoting leaf 60 in a clockwise direction about axis 62. At the same time, the negative pressure created by the collapsing bubble 260 draws face 74 of leaf 260 against the lip 276 of passage 256 to inhibit backflow of liquid from chamber 254 into chamber 54.

Figure 8:
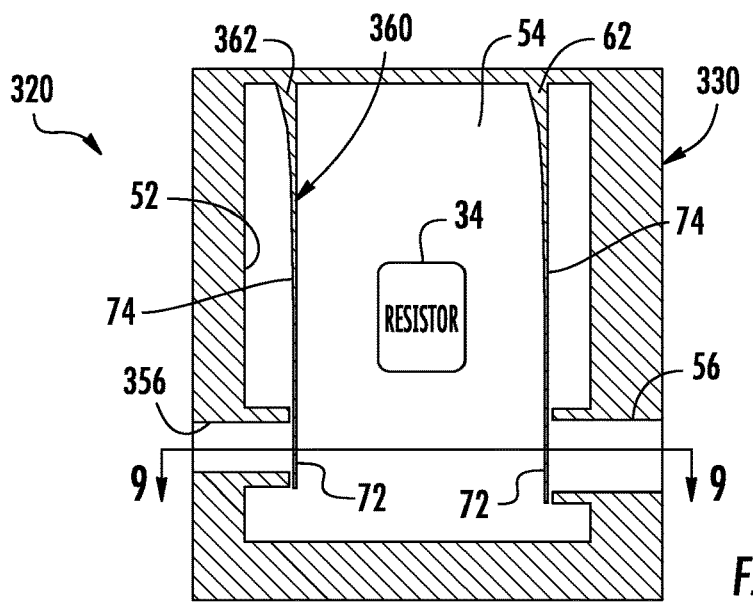
FIG. 8 is a sectional view of an example fluidic MEMS device.
Figure 9:
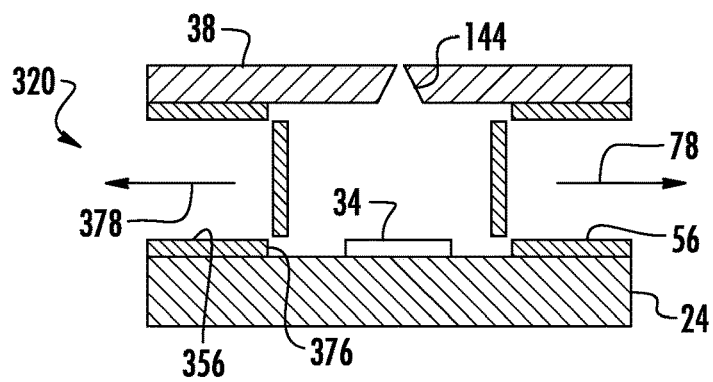
FIG. 9 is a sectional view of the device of FIG. 8 take along line 9-9.

FIGS. 8 and 9 illustrate an example fluidic MEMS device 320. FIG. 8 is a sectional view of an example fluidic MEMS device 320. FIG. 9 is a sectional view of device 320 along line 9-9 of FIG. 8. Device 320 is similar to device 120 described above except that device 320 comprises layer 330 in place of layer 30. Those remaining structures or elements of device 320 which correspond to structures or elements of device 120 are numbered similarly.

Layer 330 comprises a unitary layer or layer structure of material supported by substrate 24. Layer 330 is similar to layer 30 except that layer 330 additionally comprises passage 356 and check valve leaf 360. Those remaining structures or elements of layer 330 that correspond to structures or elements of layer 30 are numbered similarly. Passage 356 extends through one of sides 52 of chamber 54 and is in communication with an interior of chamber 54. In the example illustrated, passage 356 extends through a sidewall 52 directly opposite to passage 56.

Check valve leaf 360 is similar to check valve leaf 60 described above except that check valve leaf 360 extends from one of sides 52 of chamber 54, within chamber 54 and across passage 356. Those structures or components of check valve leaf 360 which correspond to structures or components of check valve leaf 60 are numbered similarly. As with check valve leaf 60, check valve leaf 360 is pivotable about a "living hinge. Check valve leaf 360 pivots or flexes about an axis 362 that is nonparallel to substrate 24. In the example illustrated, check valve leaf 360 is pivotable about an axis 362 that is perpendicular to substrate 24.

As with layer 30, layer 330 may have a thickness of at least 20 μm and no greater than 50 μm. In one implementation, layer 330 comprises a polymer. In one implementation, layer 330 comprises a photo-imagable or photosensitive polymer or other material that may be shaped and formed using an exposure/developing process as described herein. For example, in one implementation, layer 330 may comprise an epoxy-based negative photoresist such as SU8 (a Bisphenol A Novolac epoxy that is dissolved in an organic solvent (gamma-butyrolactone GBL or cyclopentanone, depending on the formulation) and up to 10 wt % of mixed Triarylsulfonium/hexafluoroantimonate salt as the photoacid generator)). FIG. 8 illustrates a portion of layer 330. Other portions of the same layer 330 (not shown) may form other MEMS devices or structures. For example, other portions of layer 330 may additionally form or surround at least portions of a microfluidic channel or passage, a fluid pump, fluid filter, a material separator, a sensor, a heater, an outlet or other MEMS devices.

In use, liquid may enter chamber 54 through passage 56, wherein leaf 60 may pivot about axis 62 in a clockwise direction towards resistor 34. Application of electric current to resistor 34 creates an expanding bubble, wherein liquid within chamber 54 exerts force against face 72, pivoting leaf 60 about axis 62 in a counter-clockwise direction against the lip or perimeter 76 of passage 56, sealing passage 56 or inhibiting flow through passage 56 in the direction indicated by arrow 78. At the same time, liquid within chamber 54, being pressured by the expanding bubble, exerts force against face 72, pivoting leaf 360 about axis 362 in a clockwise direction against the lip or perimeter 376 of passage 356 so as to seal against or inhibit the flow of movement through passage 356 in the direction indicated by arrow 378. The expanding bubble forces liquid within chamber 54 through outlet opening 144.

Subsequent collapse of the bubble may draw liquid back into chamber 54 to refill chamber 54. During such refilling, the negative pressure within chamber 54 may exert a force against face 74, pivoting leaf 60 in a clockwise direction about axis 62, facilitating the flow of liquid into chamber 54.

During such refilling, the negative pressure within chamber 54 may exert a force against face 74 of leaf 360, pivoting leaf 360 in a counterclockwise direction about axis 362, facilitating the flow of liquid into chamber 54. As a result, leaves 62 and 362 facilitate filling of chamber 54 through multiple inlets for faster refill of chamber 54.

Figure 10:
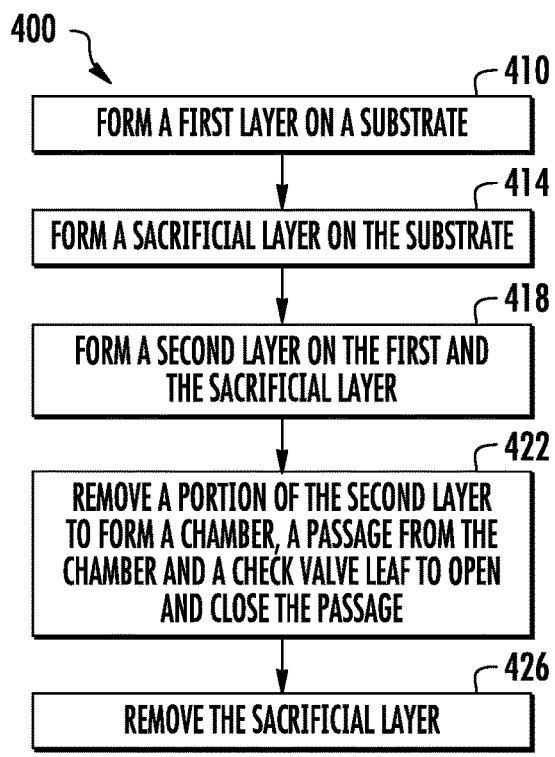
FIG. 10 is a flow diagram of an example method for forming a fluidic MEMS device.

FIG. 10 is a flow diagram of an example method 400 for forming a MEMS device. FIGS. 11-15 illustrate method 400. Although method 400 is described as being carried out to form portions of mems device 20, method 400 may also be utilized to form portions of devices 120, 220 and 320 described above.

Figure 11:
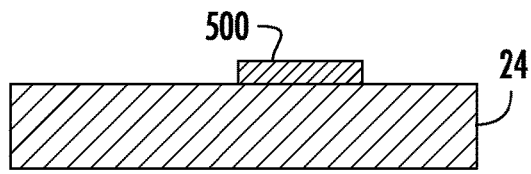
FIGS. 11, 12, 13, 14A and 15 are sectional views illustrating formation of portions of an example fluidic MEMS device according to the example method of FIG. 10.

As indicated by block 410 in FIG. 10 and illustrated in FIG. 11, a first layer 500 is formed upon substrate 24. In one implementation, layer 500 is formed by depositing a continuous layer of a polymeric photoresist material, such as SU8, upon substrate 24 using deposition process such as spin coating, followed by a soft bake. In another implementation, layer 500 may be laminated to substrate 24. Thereafter, the continuous layer undergoes exposure to light, such as ultraviolet light, through a photomask, wherein the ultraviolet light impinges those portions of the layer which are to remain (the layer 500 shown in FIG. 11). Exposure to the ultraviolet light results in cross-linking and hardening of layer 500. The exposed layer 500 undergoes a post exposure bake. The layer is then developed by diluting and removing the unexposed portions using a solvent. Lastly, the exposed, cross linked layer 500 undergoes an optional hard bake.

Figure 12:
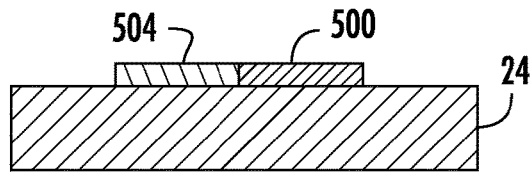

As indicated by block 414 in FIG. 10 and illustrated by FIG. 12, a sacrificial layer 504 is formed on substrate 24 adjacent to layer 500. In one implementation, layer 504 comprises a coating of a sacrificial material such as WaferBond HT10.10, commercially available from Brewer Science, Inc. of 2401 Brewer Drive, Rolla Mo. 65401. In other implementations, other sacrificial materials may be utilized for layer 504.

Figure 13:
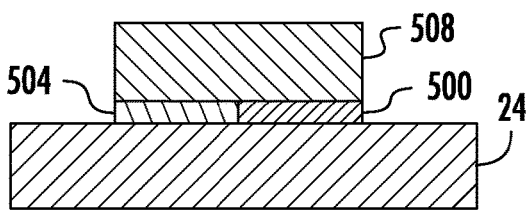

As indicated by block 418 and illustrated in FIG. 13, a second layer 508 is formed on layers 500 and 504. In one implementation, layer 508 is formed by depositing a layer of the photoresist, such as SU8, upon substrate layers 500, 504 by laminating a sheet of SU8 on layers 500 and 504.

Figure 14A:
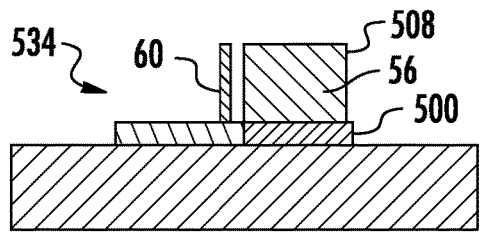
Figure 14B:
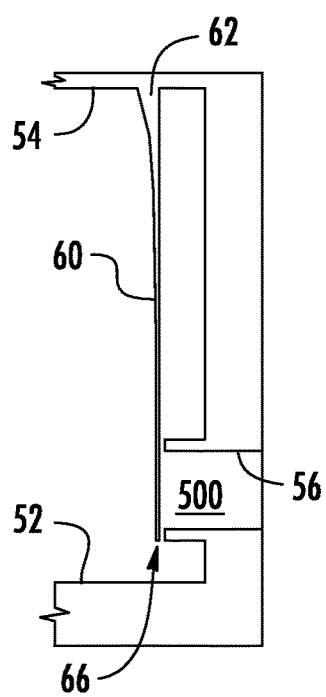
FIG. 14B is a top view illustrating one example stage in the formation of the portions of the example fluidic MEMS device according to the example method of FIG. 10.

As indicated by block 422 and illustrated in FIGS. 14A and 14B, portions of layer 508 are selectively removed to form sidewalls 52 of a chamber 54, passage 56 and check valve leaf 60. In one implementation, those portions of layer 508 that are to remain are impinged with light, such as ultraviolet light through photomask, to cross-link portions of the photoresist/SU8 layer 508. A soft bake is carried out on the exposed portions followed by development wherein the unexposed portions are diluted and washed away using a solvent. In one implementation, the remaining portion is further subjected to a hard bake.

Figure 15:
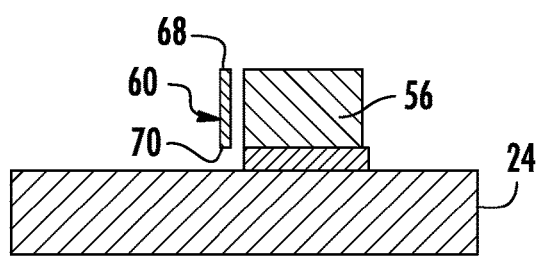

As indicated by block 426 and illustrated by FIG. 15, sacrificial layer 504 (shown in FIG. 14A) is removed. As a result, edges 68 and 70 of leaf 60 are free as is end 66, facilitating pivoting of leaf 60 about axis 62. Sacrificial layer 504 provides precise control of the gap below edge 70, ensuring that leaf 60 is free and detached while at the same time ensuring that edge 70 is not excessively shortened such that leaf 60 may not adequately seal or close passage 56. Because edges 68 and 70 are free, leaf 60 may pivot about axis 62, nonparallel to substrate 24. As a result, leaf 60 may be provided with a longer length, further enhancing the ability of leaf 60 to adequately flex or pivot for the ingress and egress of liquid into and out of chamber 54 The actions set forth in block 422 may be additionally utilized to form any of the other leaves 260 and 360 from the single unitary layers 230, 330 of the other devices 220 and 320, respectively, described above.

Figure 16:
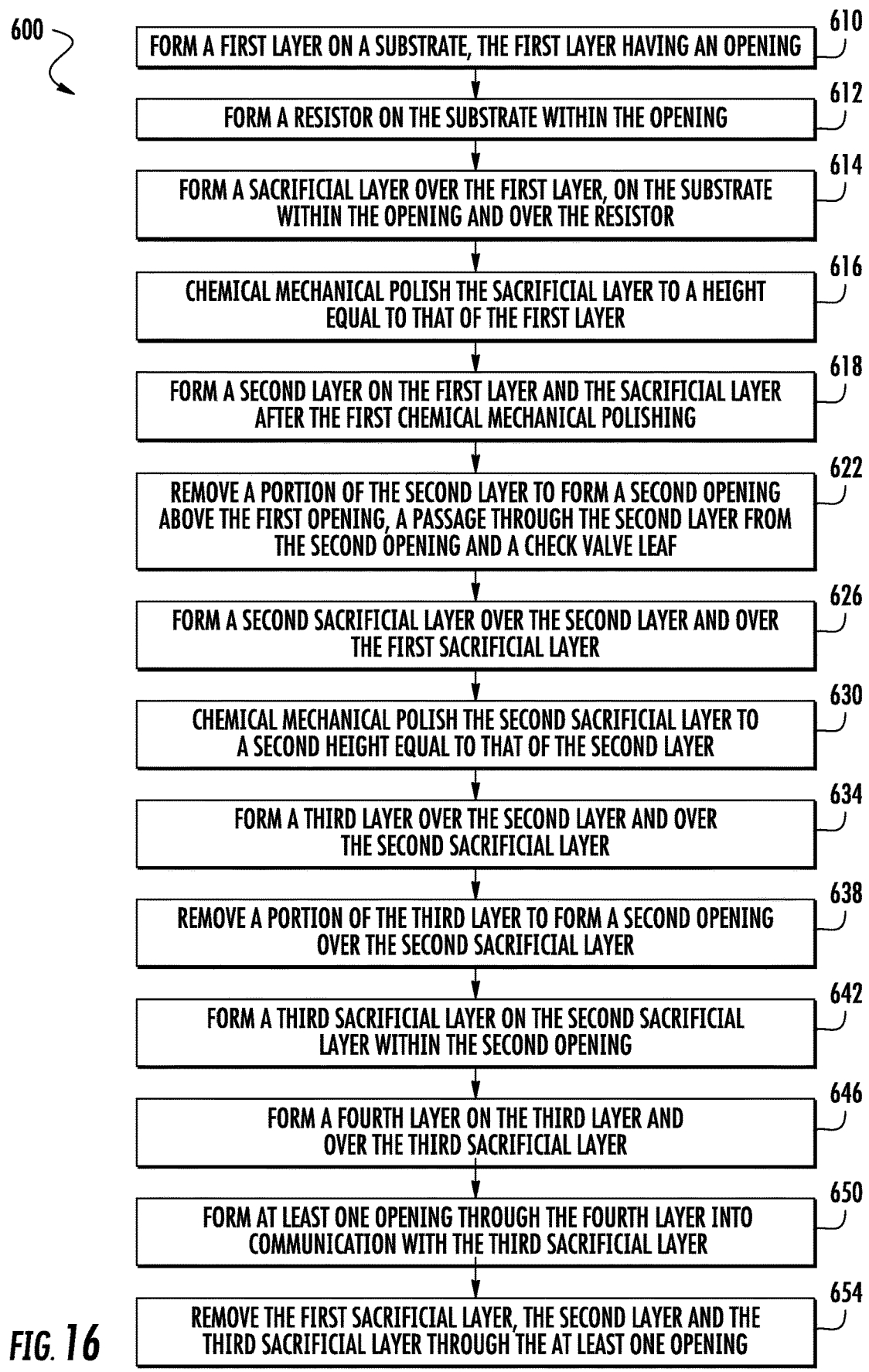
FIG. 16 is a flow diagram of an example method for forming a fluidic MEMS device.

FIG. 16 is a flow diagram of an example method 600 for forming a MEMS device. FIGS. 17-26 illustrate method 600. Although method 600 is described as being carried out to form MEMS device 220, method 600 may also be utilized to form portions of devices 20, 120 and 320 described above.

Figure 17:
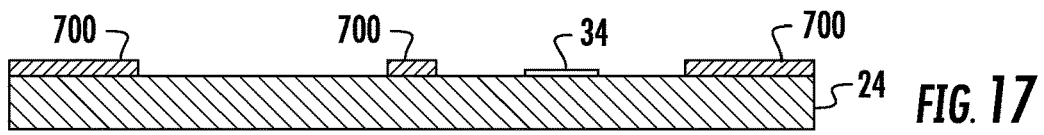
FIGS. 17-19, 20A and 21-26 are sectional views illustrating formation of portions of an example fluidic MEMS device according to the example method of FIG. 16.

As indicated by block 610 and illustrated by FIG. 17, a first layer 700 is formed upon substrate 24. In one implementation, layer 700 is formed by depositing a continuous layer of a polymeric photoresist material, such as SUB, upon substrate 24 using deposition process such as spin coating, followed by a soft bake. In another implementation, layer 700 may be laminated to substrate 24. Thereafter, the continuous layer undergoes exposure to light, such as ultraviolet light, through a photomask, wherein the ultraviolet light impinges those portions of the layer which are to remain (the three remaining portions of layer 700 shown in FIG. 17). Exposure to the ultraviolet light results in cross-linking and hardening of layer 700. The exposed layer 700 undergoes a post exposure bake. The layer is then developed by diluting and removing the unexposed portions using a solvent. Lastly, the exposed, cross-linked layer 700 undergoes an optional hard bake.

As indicated by block 612 in FIG. 16 and further illustrated by FIG. 17, resistor 34 is formed upon substrate 24 within the opening of layer 700 which is to form a lower portion of chamber 54. In one implementation, resistor 34 may be formed upon substrate 24 prior to the formation of layer 700.

Figure 18:
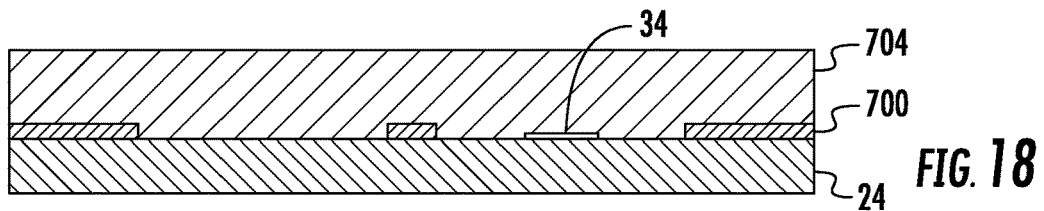
Figure 19:
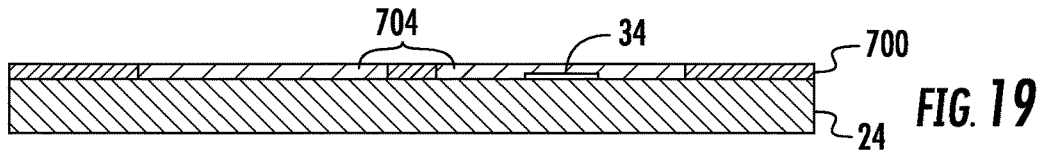

As indicated by block 614 in FIG. 16 and illustrated by FIG. 18, a sacrificial layer 704 is formed over layer 700, on substrate 24 within each of the two openings and over resistor 34. In one implementation, layer 704 is coated over layer 700, substrate 24 and resistor 34 followed by baking. In one implementation, layer 704 comprises sacrificial material such as WaferBond HT10.10, commercially available from Brewer Science, Inc. of 2401 Brewer Drive, Rolla Mo. 65401. In other implementations, other sacrificial materials may be utilized for layer 704. As indicated by block 616 in FIG. 16 and illustrated by FIG. 19, a chemical mechanical polish is performed on layer 704 such that layer 704 has a height substantially equal to that of layer 700. In one implementation, the material of layer 700, at the time of chemical mechanical polishing, has a greater resistivity to such chemical mechanical polishing such that layer 700 provides a hard stop to control the degree of chemical mechanical polishing.

Figure 20A:
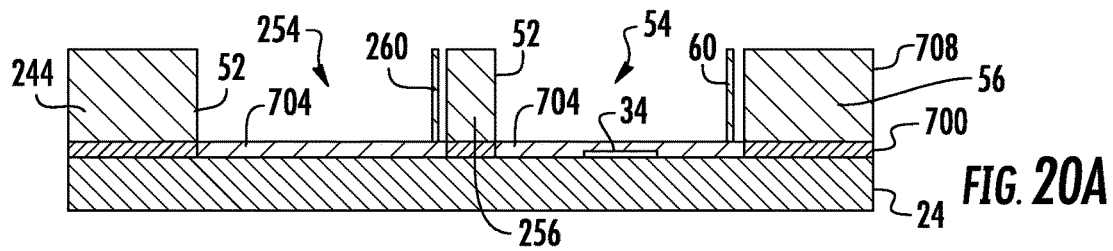
Figure 20B:
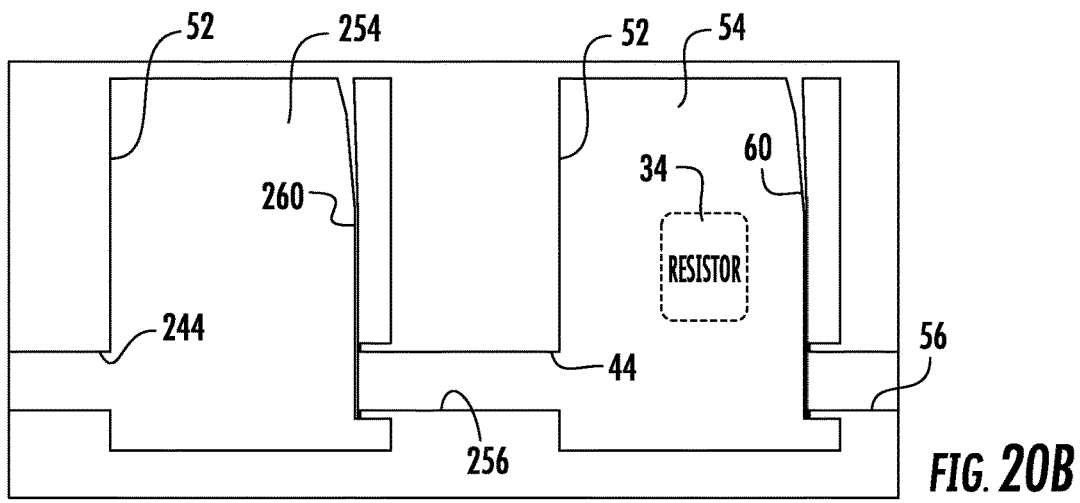
FIG. 20B is a top view illustrating one example stage in the formation of the portions of the example fluidic MEMS device according to the example method of FIG. 16.

As indicated by block 618 in FIG. 16 and illustrated by FIG. 20, a second layer 708 is formed on the first layer 700 and the sacrificial layer 704. In one implementation, layer 708 is formed by depositing a layer of the photoresist, such as SU8, upon substrate layers 700, 704 by laminating a sheet of SU8 on layers 700 and 704. As indicated by block 622 and further illustrated by FIG. 20, portions of layer 708 are selectively removed to form sidewalls 52 of chambers 54 and 254, passages 56, 256 and check valve leaves 60, 260. A top view of layer 708 after the selective removal of portions of layer 708 to form sidewalls 52 of chambers 54 and 254, passages 56, 256 and check valve leaves 60, 260 is shown in FIG. 5. In one implementation, those portions of layer 708 that are to remain are impinged with light, such as ultraviolet light through photomask, to cross-link portions of the photoresist/SU8 layer 708. A soft bake is carried out on the exposed portions followed by development wherein the unexposed portions are diluted and washed away using a solvent. In one implementation, the remaining portion is further subjected to a hard bake.

Figure 21:
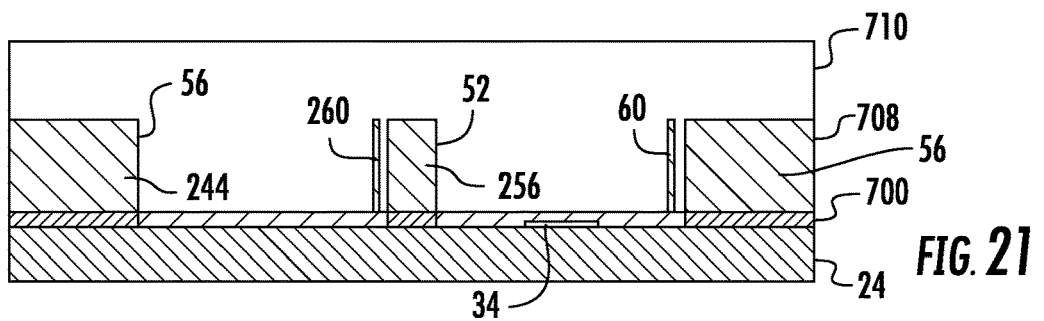
Figure 22:
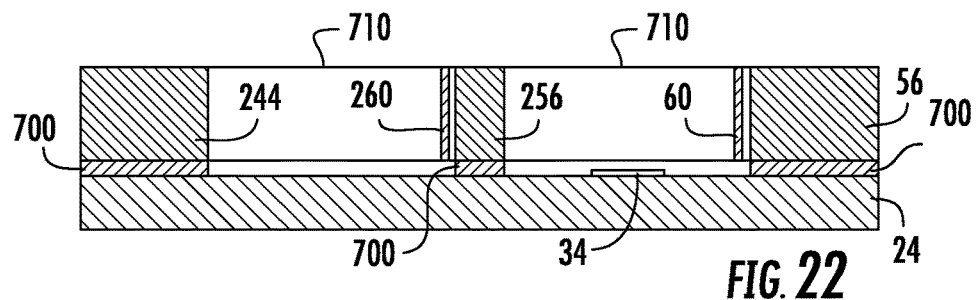

As indicated by block 626 and illustrated by FIG. 21, a second sacrificial layer 710 is formed over the second layer 708 and over the first sacrificial layer 704. In one implementation, layer 710 is coated over layer 704 and over layer 708 followed by baking. In one implementation, layer 710 comprises sacrificial material such as such as WaferBond HT10.10, commercially available from Brewer Science, Inc. of 2401 Brewer Drive, Rolla Mo. 65401. In other implementations, other sacrificial materials may be utilized for layer 710. As indicated by block 630 in FIG. 17 and illustrated by FIG. 22, a chemical mechanical polish is performed on layer 710 such that layer 710 has a height substantially equal to that of layer 708. In one implementation, the material of layer 708, at the time of chemical mechanical polishing, has a greater resistivity to such chemical mechanical polishing such that layer 708 provides a hard stop to control the degree of chemical mechanical polishing.

Figure 23:
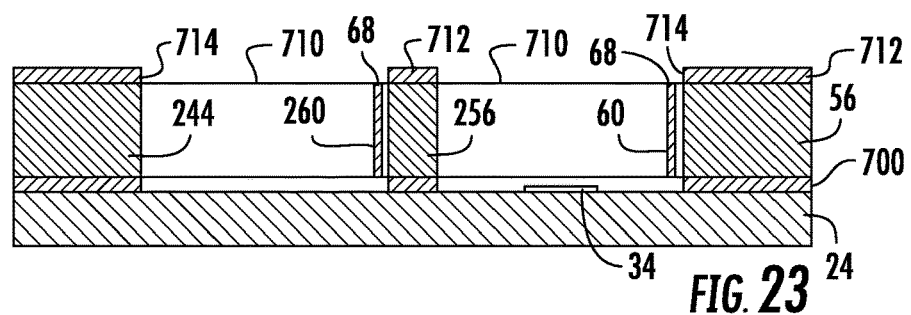

As indicated by block 634 and illustrated by FIG. 23, a third layer 712 is formed over the second layer 708 and over sacrificial layer 710. In one implementation, layer 712 is formed by depositing a layer of the photoresist, such as SU8, upon substrate layers 708, 710 by laminating a sheet of SU8 on layers 708 and 710. As indicated by block 638 and further illustrated by FIG. 23, portions of layer 712 are selectively removed to form openings 714 which extend over edge 68 of each of leaves 60, 260. Those portions of layer 712 that are to remain are impinged with light, such as ultraviolet light through photomask, to cross-link portions of the photoresist/SU8 layer 712. A soft bake is carried out on the exposed portions followed by development, wherein the unexposed portions are diluted and washed away using a solvent. In one implementation, the remaining portion is further subjected to a hard bake.

Figure 24:
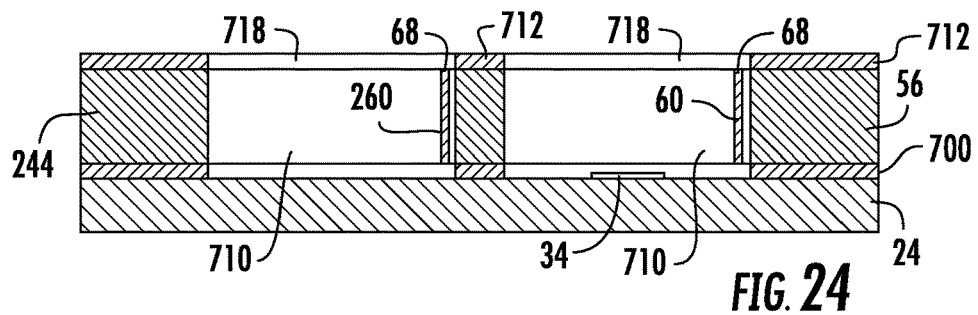

As indicated by block 642 and illustrated by FIG. 24, a third sacrificial layer 718 is formed within each of opening 714, on sacrificial layer 710 and over edge 68 of each of leaves 60, 260. In one implementation, layer 718 is coated followed by baking. In one implementation, layer 718 comprises sacrificial material such as WaferBond HT10.10, commercially available from Brewer Science, Inc. of 2401 Brewer Drive, Rolla Mo. 65401. In other implementations, other sacrificial materials may be utilized for layer 718. As further illustrated by FIG. 24, a chemical mechanical polish is performed on layer 718 such that layer 718 has a height substantially equal to that of layer 712. In one implementation, the material of layer 712, at the time of chemical mechanical polishing, has a greater resistivity to such chemical mechanical polishing such that layer 712 provides a hard stop to control the degree of chemical mechanical polishing.

Figure 25:
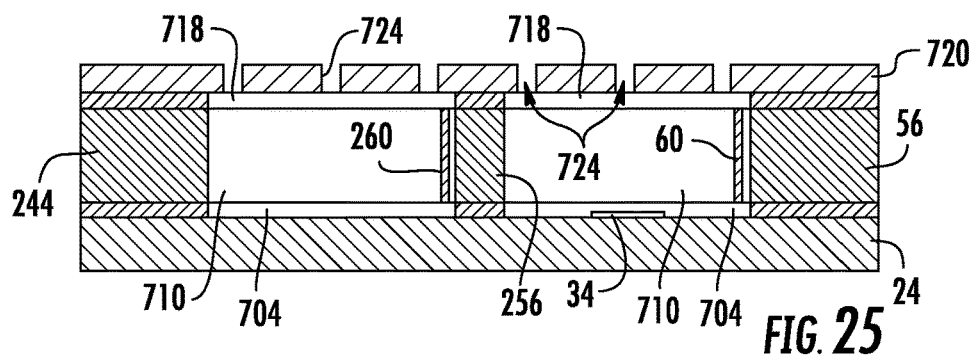

As indicated by block 646 and illustrated by FIG. 25, a fourth layer 720 is formed over layer 712 and over the third sacrificial layer 718. Layer 720 forms a cap layer or lid 38 in the final device 220. In one implementation, layer 720 is formed by depositing a layer of the photoresist, such as SU8, upon substrate layers 712, 718 by laminating a sheet of SU8 on layers 712 and 718.

As further indicated by block 650 in FIG. 16 and illustrated by FIG. 25, at least one opening 724 (also referred to as a clear hole) is formed through layer 720 which communicates with the third sacrificial layer 718 in each of openings 714. In one implementation, those portions of layer 720 that are to remain are impinged with light, such as ultraviolet light through photomask, to cross-link portions of the photoresist/SU8 layer 720. A soft bake is carried out on the exposed portions followed by development wherein the unexposed portions are diluted and washed away using a solvent. In one implementation, the remaining portion is further subjected to a hard bake.

Figure 26:
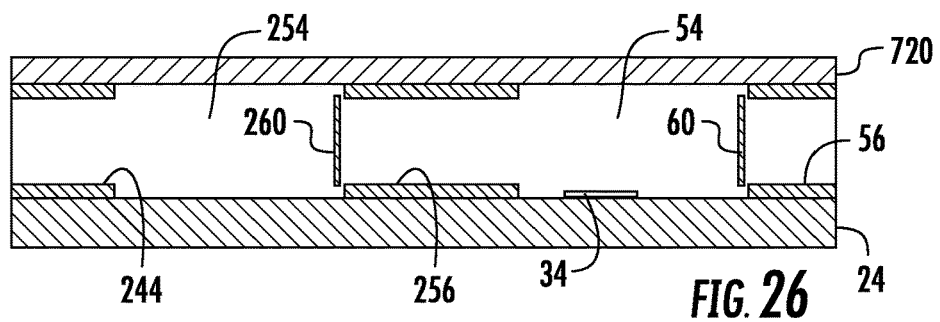

As indicated by block 654 in FIG. 16 and illustrated in FIG. 26, a solvent is selected and applied through openings 724 so as to remove the material of sacrificial layer 718, 710 and 704, leaving device 220. As further shown by FIG. 26, openings 724 are covered, sealed or capped. In one implementation, openings 724 are sealed with a tape. In other implementations, openings 724 may be sealed in other fashions.

Although the present disclosure has been described with reference to example implementations, workers skilled in the art will recognize that changes may be made in form and detail without departing from the spirit and scope of the claimed subject matter. For example, although different example implementations may have been described as including one or more features providing one or more benefits, it is contemplated that the described features may be interchanged with one another or alternatively be combined with one another in the described example implementations or in other alternative implementations. Because the technology of the present disclosure is relatively complex, not all changes in the technology are foreseeable. The present disclosure described with reference to the example implementations and set forth in the following claims is manifestly intended to be as broad as possible. For example, unless specifically otherwise noted, the claims reciting a single particular element also encompass a plurality of such particular elements. The terms "first", "second", "third" and so on in the claims merely distinguish different elements and, unless otherwise stated, are not to be specifically associated with a particular order or particular numbering of elements in the disclosure.

What is claimed is:

1. A fluidic micro electromechanical system comprising:
   a substrate;
   a first layer supported by the substrate, the first layer forming:
      sides of a chamber;
      a passage through one of the sides and a chamber; and
      a check valve leaf, the check valve leaf being pivotable about an axis nonparallel to the substrate to open and close the passage;
   a second layer over the chamber;
   an opening into the chamber; and
   a resistor supported within the chamber.

2. The fluidic micro electromechanical system of claim 1, wherein the layer further forms:
   sides of a second chamber;
   a second passage connecting the second chamber to the first chamber; and
   a second check valve leaf, the second check valve leaf being pivotable about a second axis nonparallel to the substrate to open and close the second passage.

3. The fluidic micro electromechanical system of claim 2, wherein the first layer comprises a photo imagable material.

4. The fluidic micro electromechanical system of claim 2, wherein the first layer has a thickness of at least 20 µm and no greater than 50 µm.

5. The fluidic micro electromechanical system of claim 2, wherein the check valve leaf is pivotable in a rotational direction to close the passage and wherein the second check valve leaf is pivotable in the rotational direction to close the second passage.

6. The fluidic micro electromechanical system of claim 5, wherein the check valve leaf is pivotable in a first rotational direction to close the passage and wherein the second check valve leaf is pivotable in a second rotational direction, opposite the first rotational direction, to close the second passage.

7. The fluidic micro electromechanical system of claim 2, wherein the opening comprises a nozzle opening opposite the chamber.

8. The fluidic micro electromechanical system of claim 1, wherein the layer comprises a photo imagable material.

9. The fluidic micro electromechanical system of claim 8, wherein the layer has a thickness of at least 20 μm and no greater than 50 μm.

10. The fluidic micro electromechanical system of claim 1, wherein the check valve leaf has a fixed end, a free end and a length between the fixed end and the free end of at least 20 um.

\* \* \* \* \*